United States Patent
Balasubramaniam (10) Patent No.: US 7,595,005 B2
(45) Date of Patent: Sep. 29, 2009

(54) METHOD AND APPARATUS FOR ASHING A SUBSTRATE USING CARBON DIOXIDE

(75) Inventor: Vaidyanathan Balasubramaniam, Woburn, MA (US)

(73) Assignee: Tokyo Electron Limited, Tokyo (JP)

( * ) Notice: Subject to any disclaimer, the term of this patent is extended or adjusted under 35 U.S.C. 154(b) by 202 days.

(21) Appl. No.: 11/608,872

(22) Filed: Dec. 11, 2006

(65) Prior Publication Data

US 2008/0135517 A1 Jun. 12, 2008

(51) Int. Cl.
*C03C 15/00* (2006.01)
(52) U.S. Cl. .............. 216/67; 216/37; 438/706; 438/710; 438/711; 438/725
(58) Field of Classification Search .............. 216/67; 438/689
See application file for complete search history.

(56) References Cited

U.S. PATENT DOCUMENTS

| | | | |
|---|---|---|---|
| 7,279,427 B2* | 10/2007 | Nishino et al. ........... | 438/706 |
| 7,288,484 B1 | 10/2007 | Goto et al. | |
| 7,396,769 B2 | 7/2008 | Hudson et al. | |
| 2004/0168705 A1 | 9/2004 | Sun et al. | |
| 2005/0118541 A1* | 6/2005 | Ahn et al. ............... | 430/464 |
| 2005/0194354 A1* | 9/2005 | Onishi et al. ............ | 216/67 |
| 2006/0199370 A1 | 9/2006 | Dai et al. | |
| 2007/0059933 A1 | 3/2007 | Tahara et al. | |
| 2008/0020584 A1 | 1/2008 | Hirotsu et al. | |
| 2008/0044995 A1 | 2/2008 | Kang et al. | |
| 2008/0248656 A1 | 10/2008 | Chen et al. | |

* cited by examiner

*Primary Examiner*—Binh X Tran
*Assistant Examiner*—Maki Angadi
(74) *Attorney, Agent, or Firm*—Oblon, Spivak, McClelland, Maier & Neustadt, P.C.

(57) ABSTRACT

A method and apparatus for removing residue, such as etch reside, from a substrate with substantially reduced damage to the substrate in a plasma processing system is described. A plasma ashing process comprising carbon dioxide ($CO_2$) and optionally a passivation gas, such as a hydrocarbon gas, i.e., $C_xH_y$, wherein x, y represent integers greater than or equal to unity, is used to remove residue while reducing damage to underlying dielectric layers. Additionally, the process chemistry can further comprise the addition of an inert gas, such as a Noble gas (i.e., He, Ne, Ar, Kr, Xe, Rn).

20 Claims, 8 Drawing Sheets

METHOD AND APPARATUS FOR ASHING A SUBSTRATE USING CARBON DIOXIDE

FIELD OF THE INVENTION

The present invention relates to a method and apparatus for removing residue from a substrate.

BACKGROUND OF THE INVENTION

During semiconductor processing, a (dry) plasma etch process can be utilized to remove or etch material along fine lines or within vias or contacts patterned on a silicon substrate. The plasma etch process generally involves positioning a semiconductor substrate with an overlying patterned, protective layer, for example a photoresist layer, in a processing chamber. Once the substrate is positioned within the chamber, an ionizable, dissociative gas mixture is introduced within the chamber at a pre-specified flow rate, while a vacuum pump is throttled to achieve an ambient process pressure. Thereafter, a plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, selected surfaces of the substrate are etched by the plasma. The process is adjusted to achieve appropriate conditions, including an appropriate concentration of desirable reactant and ion populations to etch various features (e.g., trenches, vias, contacts, etc.) in the selected regions of the substrate. Such substrate materials where etching is required include silicon dioxide ($SiO_2$), low dielectric constant (i.e., low-k) dielectric materials, poly-silicon, and silicon nitride. Once the pattern is transferred from the patterned photoresist layer to the underlying dielectric layer, using, for example, dry plasma etching, the remaining layer of photoresist, and post-etch residues, are removed via an ashing (or stripping) process. For instance, in conventional ashing processes, the substrate having the remaining photoresist layer is exposed to an oxygen plasma formed from the introduction of diatomic oxygen ($O_2$) and ionization/dissociation thereof.

SUMMARY OF THE INVENTION

The present invention relates to a method of removing residue on a substrate using a plasma ashing process. The plasma ashing process utilizes a process gas comprising carbon dioxide. Additionally, the process gas can comprise a passivation gas, such as a hydrocarbon gas.

According to one embodiment, a method for removing residue from a substrate and a computer readable medium with program instructions to cause a computer system to control a residue removal process is described, comprising: disposing the substrate in a plasma processing system, the substrate having a dielectric layer formed thereon and a mask layer overlying the dielectric layer, wherein the mask layer comprises a pattern formed therein and the dielectric layer comprises a feature formed therein as a result of an etching process used to transfer the pattern in the mask layer to the dielectric layer; introducing a process gas comprising carbon dioxide ($CO_2$); forming a plasma from the process gas in the plasma processing system; and removing the mask layer from the substrate with the plasma.

According to another embodiment, a plasma processing system for removing photoresist from a substrate is described, comprising: a plasma processing chamber for facilitating the formation of a plasma from a process gas; and a controller coupled to the plasma processing chamber and configured to execute a process recipe utilizing the process gas to form a plasma to remove the photoresist from the substrate, wherein the process gas comprises carbon dioxide ($CO_2$).

DETAILED DESCRIPTION OF SEVERAL EMBODIMENTS

In the following description, for purposes of explanation and not limitation, specific details are set forth, such as a particular geometry of the plasma processing system and descriptions of various processes. However, it should be understood that the invention may be practiced in other embodiments that depart from these specific details.

In material processing methodologies, pattern etching comprises the application of a thin layer of light-sensitive material, such as photo-resist, to an upper surface of a substrate that is subsequently patterned in order to provide a mask for transferring this pattern to the underlying thin film on a substrate during etching. The patterning of the light-sensitive material generally involves exposure of the light-sensitive material to a geometric pattern of electro-magnetic (EM) radiation using, for example, a micro-lithography system, followed by the removal of the irradiated regions of the light-sensitive material (as in the case of positive photo-resist), or non-irradiated regions (as in the case of negative resist) using a developing solvent. Moreover, this mask layer may comprise multiple sub-layers.

Figure 1A:
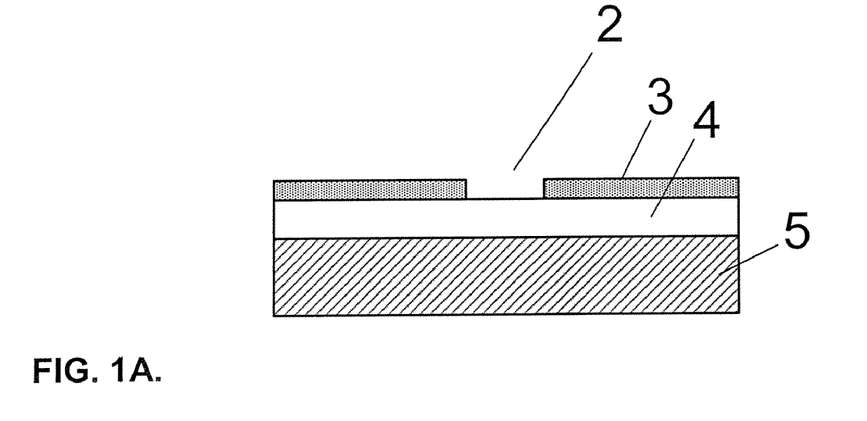
FIGS. 1A, 1B, and 1C show another schematic representation of a typical procedure for pattern etching a thin film.
Figure 1B:
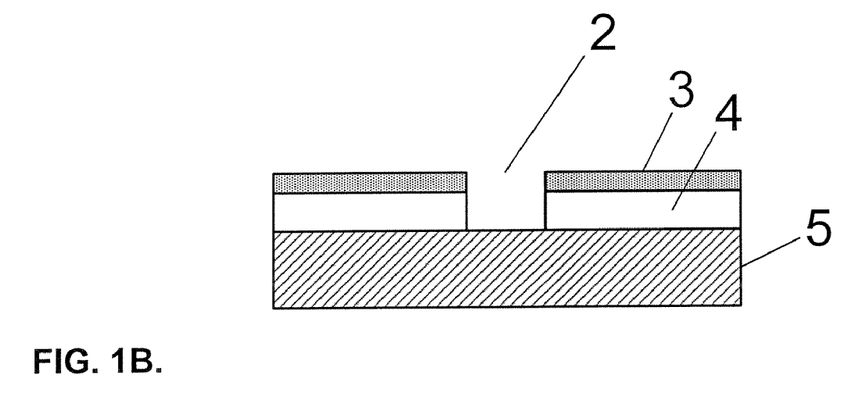
Figure 1C:
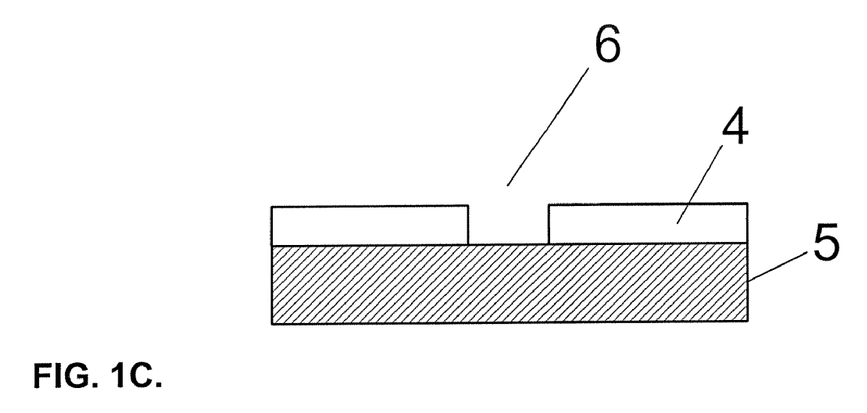

For example, as shown in FIGS. 1A through 1C, a mask comprising light-sensitive layer 3 with pattern 2 (such as patterned photoresist) can be utilized for transferring feature patterns into a thin film 4 on a substrate 5. The pattern 2 is transferred to the thin film 4 using, for instance, dry plasma etching in order to form feature 6. Upon completion of etching, the mask 3 is removed.

As noted above, the mask is conventionally removed by exposing the mask to a plasma formed from a gas containing $O_2$. The present inventors have recognized, however, that such a method can damage dielectric films, and in particular low-k dielectric films. Such damage may be damage that affects the critical dimension of a feature etched in the dielectric, or damage that increases the dielectric constant of the dielectric. The inventors further recognized that carbon can passivate dielectric and low-k films to minimize damage to such films. Thus, in one embodiment, a process gas comprising carbon dioxide ($CO_2$) is utilized for removing mask 3. The use of $CO_2$ can reduce damage to the dielectric when compared to $O_2$ plasma etching process. In another embodiment, a process gas comprising carbon dioxide ($CO_2$) and a passivation gas is utilized for removing mask 3. For example, the passivation gas can include a hydrocarbon gas ($C_xH_y$), wherein x, y represent integers greater than or equal to unity. The hydrocarbon gas ($C_xH_y$) can include one or more of $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$, or two or more thereof. Alternatively, the process gas can further comprise an inert gas, such as a Noble gas (i.e., He, Ne, Ar, Kr, Xe, Rn). Alternatively yet, the process gas can further comprise $O_2$, CO, NO, $NO_2$, or $N_2O$, or a combination of two or more thereof.

Figure 2:
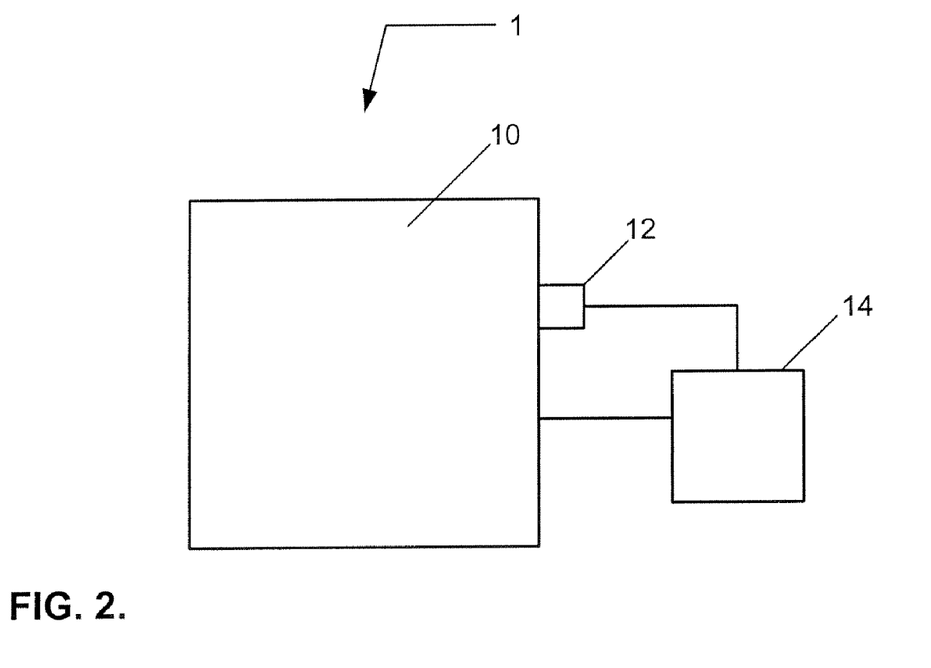
FIG. 2 shows a simplified schematic diagram of a plasma processing system according to an embodiment of the invention.

According to one embodiment, a plasma processing system 1 is depicted in FIG. 2 comprising a plasma processing chamber 10, a diagnostic system 12 coupled to the plasma processing chamber 10, and a controller 14 coupled to the diagnostic system 12 and the plasma processing chamber 10. The controller 14 is configured to execute a process recipe comprising at least one of the above-identified chemistries (i.e. $CO_2$ with and without $C_xH_y$ and/or other gases, etc.) to remove photoresist and/or other residue, such as etch residue, from a substrate. Additionally, controller 14 is configured to receive at least one endpoint signal from the diagnostic system 12 and to post-process the at least one endpoint signal in order to accurately determine an endpoint for the process. In the illustrated embodiment, plasma processing system 1, depicted in FIG. 2, utilizes plasma for material processing. Plasma processing system 1 can comprise an etch chamber, and ash chamber, or combination thereof.

Figure 3:
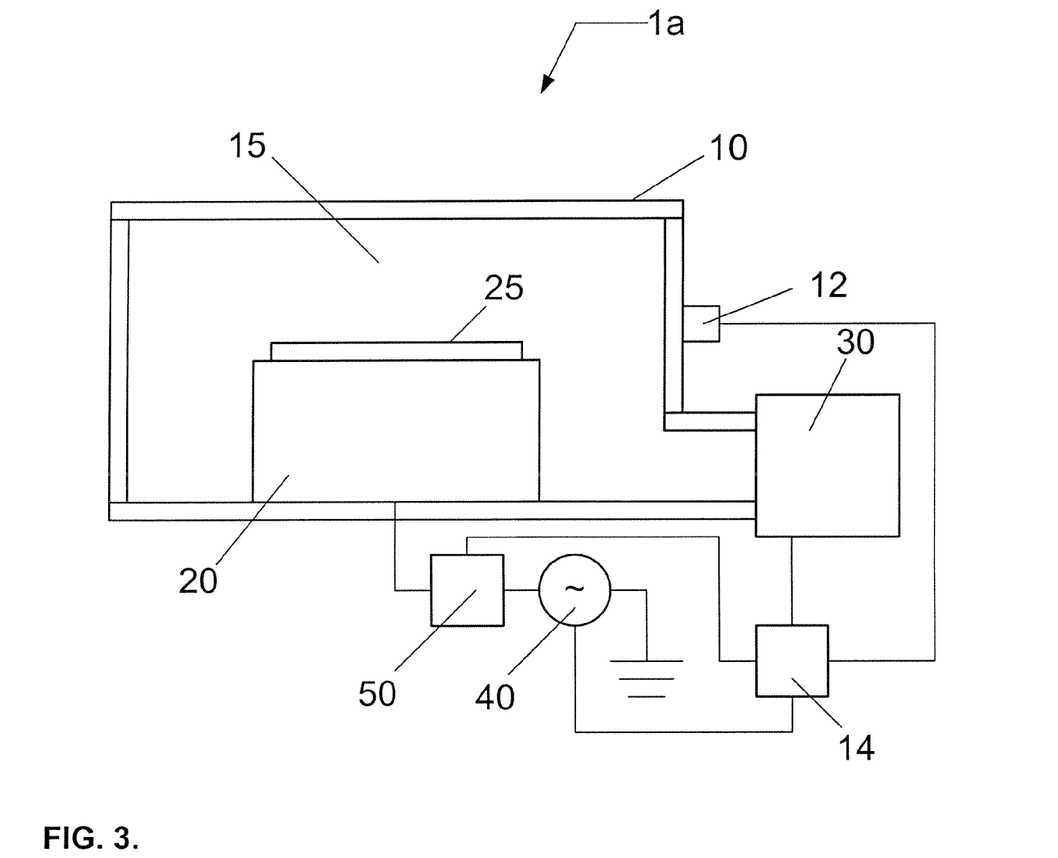
FIG. 3 shows a schematic diagram of a plasma processing system according to another embodiment of the invention.

According to the embodiment depicted in FIG. 3, plasma processing system 1a can comprise plasma processing chamber 10, substrate holder 20, upon which a substrate 25 to be processed is affixed, and vacuum pumping system 30. Substrate 25 can be a semiconductor substrate, a wafer or a liquid crystal display. Plasma processing chamber 10 can be configured to facilitate the generation of plasma in processing region 15 adjacent a surface of substrate 25. An ionizable gas or mixture of gases is introduced via a gas injection system (not shown) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The plasma processing system 1a can be configured to process substrates of any desired size, such as 200 mm substrates, 300 mm substrates, or larger.

Substrate 25 can be affixed to the substrate holder 20 via an electrostatic clamping system Furthermore, substrate holder 20 can further include a cooling system including a re-circulating coolant flow that receives heat from substrate holder 20 and transfers heat to a heat exchanger system (not shown), or when heating, transfers heat from the heat exchanger system. Moreover, gas can be delivered to the back-side of substrate 25 via a backside gas system to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the helium gas gap pressure can be independently varied between the center and the edge of substrate 25. In other embodiments, heating/cooling elements, such as resistive heating elements, or thermoelectric heaters/coolers can be included in the substrate holder 20, as well as the chamber wall of the plasma processing chamber 10 and any other component within the plasma processing system 1a.

In the embodiment shown in FIG. 3, substrate holder 20 can comprise an electrode through which RF power is coupled to the processing plasma in process space 15. For example, substrate holder 20 can be electrically biased at a RF voltage via the transmission of RF power from a RF generator 40 through an impedance match network 50 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 50 serves to improve the transfer of RF power to plasma in plasma processing chamber 10 by reducing the reflected power. Match network topologies (e.g. L-type, π-type, T-type, etc.) and automatic control methods are well known to those skilled in the art.

Furthermore, the plasma processing system 1a comprises a gas injection system (not shown) configured to introduce process gases to processing region 15. The gas injection system may include a shower head gas injection system located above the substrate, which is well known to those skilled in the art of vacuum processing. Alternatively, the gas injection system may include a multi-zone gas injection system. For example, the gas injection system can include a first set of gas injection orifices coupled to a gas supply system and configured to introduce process gas to a substantially central region above the substrate, and a second set of gas injection orifices coupled to a gas supply system and configured to introduce process gas to a substantially peripheral region above the substrate.

Vacuum pump system 30 can include a turbo-molecular vacuum pump (TMP) capable of a pumping speed up to about 5000 liters per second (and greater) and a gate valve for throttling the chamber pressure. In conventional plasma processing devices utilized for dry plasma etch, a 1000 to 3000 liter per second TMP is generally employed. TMPs are useful for low pressure processing, typically less than about 50 mtorr. For high pressure processing (i.e., greater than about 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Controller 14 comprises a microprocessor, memory, and a digital I/O port capable of generating control voltages sufficient to communicate and activate inputs to plasma processing system 1a as well as monitor outputs from plasma processing system 1a. Moreover, controller 14 can be coupled to and can exchange information with RF generator 40, impedance match network 50, the gas injection system (not shown), vacuum pump system 30, as well as the backside gas delivery system (not shown), the substrate/substrate holder temperature measurement system (not shown), and/or the electrostatic clamping system (not shown). For example, a program stored in the memory can be utilized to activate the inputs to the aforementioned components of plasma processing system $1a$ according to a process recipe in order to perform the method of removing photoresist from a substrate. One example of controller 14 is a DELL PRECISION WORKSTATION 610™, available from Dell Corporation, Austin, Tex.

Controller 14 can be locally located relative to the plasma processing system $1a$, or it can be remotely located relative to the plasma processing system $1a$. For example, controller 14 can exchange data with plasma processing system $1a$ using at least one of a direct connection, an intranet, and the internet. Controller 14 can be coupled to an intranet at, for example, a customer site (i.e., a device maker, etc.), or it can be coupled to an intranet at, for example, a vendor site (i.e., an equipment manufacturer). Additionally, for example, controller 14 can be coupled to the internet. Furthermore, another computer (i.e., controller, server, etc.) can, for example, access controller 14 to exchange data via at least one of a direct connection, an intranet, and the internet.

The diagnostic system 12 can include an optical diagnostic subsystem (not shown). The optical diagnostic subsystem can comprise a detector such as a (silicon) photodiode or a photomultiplier tube (PMT) for measuring the light intensity emitted from the plasma. The diagnostic system 12 can further include an optical filter such as a narrow-band interference filter. In an alternate embodiment, the diagnostic system 12 can include at least one of a line CCD (charge coupled device), a CID (charge injection device) array, and a light dispersing device such as a grating or a prism. Additionally, diagnostic system 12 can include a monochromator (e.g., grating/detector system) for measuring light at a given wavelength, or a spectrometer (e.g., with a rotating grating) for measuring the light spectrum such as, for example, the device described in U.S. Pat. No. 5,888,337, the entire content of which is incorporated herein by reference.

The diagnostic system 12 can include a high resolution Optical Emission Spectroscopy (OES) sensor such as from Peak Sensor Systems, or Verity Instruments, Inc. Such an OES sensor has a broad spectrum that spans the ultraviolet (UV), visible (VIS), and near infrared (NIR) light spectrums. The resolution is approximately 1.4 Angstroms; that is, the sensor is capable of collecting 5550 wavelengths from 240 to 1000 nm. The OES sensor can be equipped with high sensitivity miniature fiber optic UV-VIS-NIR spectrometers which are, in turn, integrated with 2048 pixel linear CCD arrays.

The spectrometers receive light transmitted through single or bundled optical fibers, where the light output from the optical fibers is dispersed across the line CCD array using a fixed grating. Similar to the configuration described above, light emitting through an optical vacuum window is focused onto the input end of the optical fibers via a convex spherical lens. Three spectrometers, each specifically tuned for a given spectral range (UV, VIS and NIR), can form a sensor for a process chamber. Each spectrometer can include an independent A/D converter. And lastly, depending upon the sensor utilization, a full emission spectrum can be recorded every 0.1 to 1.0 seconds.

In the embodiment shown in FIG. 4, the plasma processing system $1b$ can be similar to the embodiment of FIG. 3 and further comprise either a stationary, or mechanically or electrically rotating magnetic field system 60, in order to potentially increase plasma density and/or improve plasma processing uniformity, in addition to those components described with reference to FIG. 3. Moreover, controller 14 can be coupled to magnetic field system 60 in order to regulate the speed of rotation and field strength. The design and implementation of a rotating magnetic field is well known to those skilled in the art.

Figure 4:
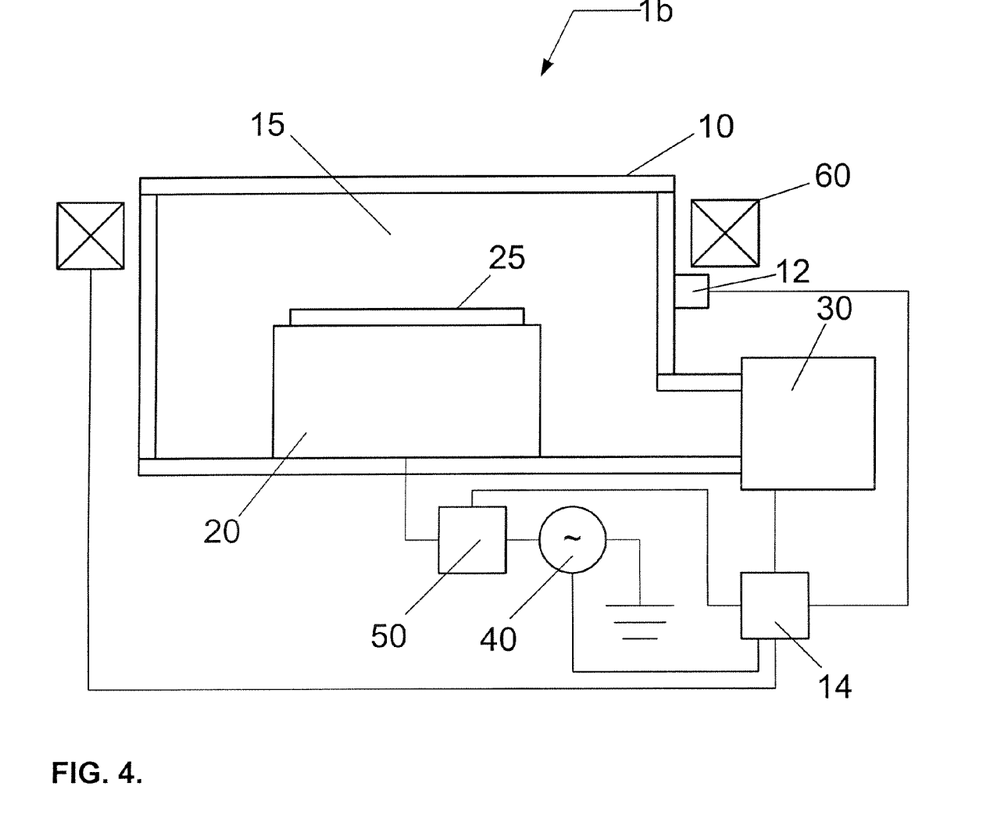
FIG. 4 shows a schematic diagram of a plasma processing system according to another embodiment of the invention.
Figure 5:
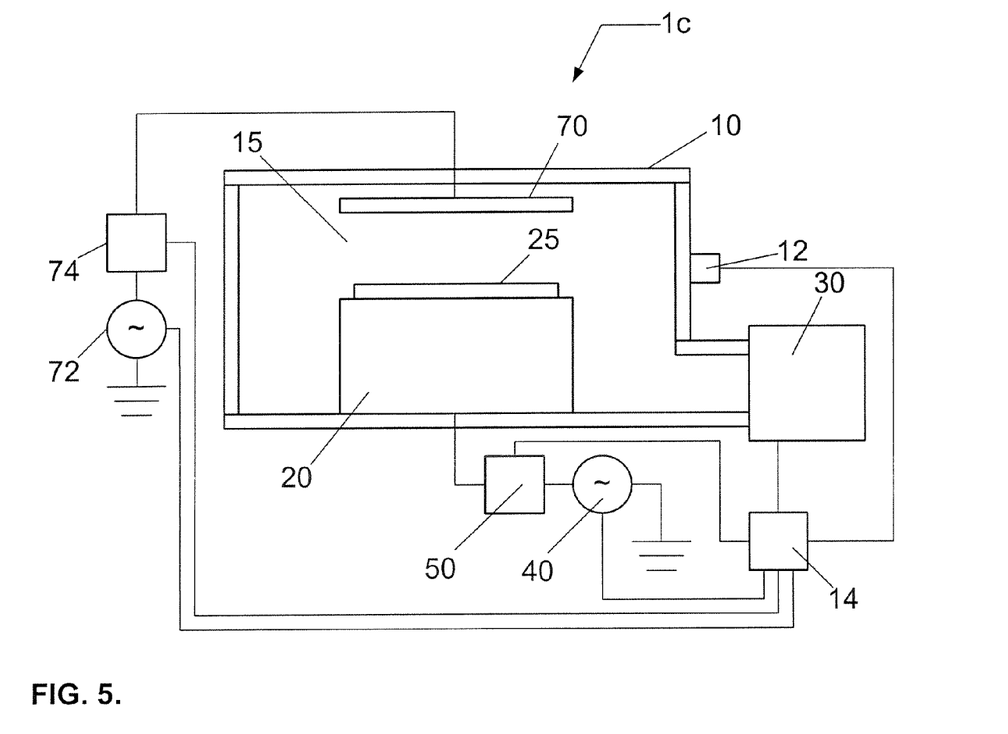
FIG. 5 shows a schematic diagram of a plasma processing system according to another embodiment of the invention.

In the embodiment shown in FIG. 5, the plasma processing system $1c$ can be similar to the embodiment of FIG. 3 or FIG. 4, and can further comprise an upper electrode 70 to which RF power can be coupled from RF generator 72 through impedance match network 74. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 14 is coupled to RF generator 72 and impedance match network 74 in order to control the application of RF power to upper electrode 70. The design and implementation of an upper electrode is well known to those skilled in the art.

Figure 6:
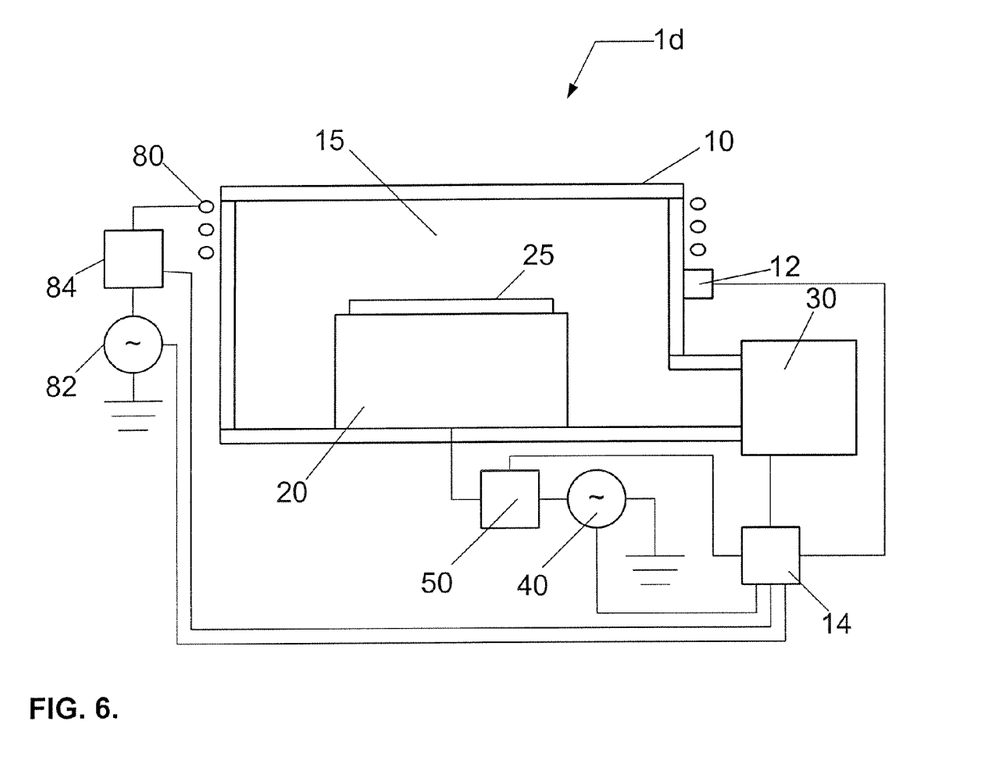
FIG. 6 shows a schematic diagram of a plasma processing system according to another embodiment of the invention.

In the embodiment shown in FIG. 6, the plasma processing system $1d$ can be similar to the embodiments of FIGS. 3, 4 and 5, and can further comprise an inductive coil 80 to which RF power is coupled via RF generator 82 through impedance match network 84. RF power is inductively coupled from inductive coil 80 through a dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma. Moreover, controller 14 is coupled to RF generator 82 and impedance match network 84 in order to control the application of power to inductive coil 80. In an alternate embodiment, inductive coil 80 can be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

In the following discussion, a method of removing a mask layer or residue or both from a substrate utilizing a plasma processing device is presented. The plasma processing device can comprise various elements, such as described in FIGS. 2 through 6, and combinations thereof.

In one embodiment, the removal process comprises forming plasma from a process gas including carbon dioxide. In another embodiment, the process gas further includes a passivation gas, such as a hydrocarbon gas ($C_xH_y$). For example, a process parameter space can comprise a chamber pressure of about 20 to about 1000 mTorr, a $CO_2$ process gas flow rate ranging from about 50 to about 1000 sccm, an optional $C_xH_y$ process gas flow rate ranging from about 50 to about 1000 sccm, an upper electrode (e.g., element 70 in FIG. 5) RF bias ranging from about 500 to about 2000 W, and a lower electrode (e.g., element 20 in FIG. 5) RF bias ranging from about 10 to about 500 W. Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

In another alternate embodiment, RF power is supplied to the upper electrode and not the lower electrode. In another alternate embodiment, RF power is supplied to the lower electrode and not the upper electrode.

In general, the time to remove the mask layer or residue or both can be determined using design of experiment (DOE) techniques; however, it can also be determined using endpoint detection. One possible method of endpoint detection is to monitor a portion of the emitted light spectrum from the plasma region that indicates when a change in plasma chemistry occurs due to substantially near completion of the etched in the dielectric. Table 1 presents the shift in critical dimensions (CD shift; measured in nanometers, m) of a feature etched in the ULK film, following various dry plasma ashing processes (presented in Table 1), and a HF wet clean. The CD shift is provided at the feature top (Top), feature mid-depth (Mid) and feature bottom (Bot) for features that are densely populated within the ULK film (dense ULK CD shift) and for features that are not densely populated within the ULK film (isolated (Iso) ULK CD shift).

TABLE 1

| | Ash Step | | | | Dense ULK CD Shift | | | | | | Iso ULK CD Shift | | | | | |
|---|---|---|---|---|---|---|---|---|---|---|---|---|---|---|---|---|
| | | | | | Center | | | Edge | | | Center | | | Edge | | |
| Coupon | Pressure | Bias Power | Process gas | Process variations | Top | Mid | Bot | Top | Mid | Bot | Top | Mid | Bot | Top | Mid | Bot |
| C0 | 100 mT | 600 W | CO2 = 750 sccm | No | 25 | 9 | 7 | — | — | — | 28 | 9 | 7 | 34 | 13 | 10 |
| C1 | 100 mT | 400 W | CO2 = 750 sccm | No | 40 | 16 | 6 | 46 | 18 | 7 | 45 | 18 | 7 | 45 | 18 | 7 |
| C2 | 75 mT | 400 W | CO2 = 750 sccm | No | 36 | 13 | 5 | 38 | 15 | 6 | 39 | 16 | 6 | 38 | 15 | 5 |
| C3 | 100 mT | 800 W | CO2 = 750 sccm | No | 21 | 7 | 5 | 24 | 10 | 5 | 23 | 7 | 5 | 23 | 11 | 5 |
| C4 | 100 mT | 600 W | CO2 = 1000 sccm | No | 26 | 7 | 5 | 28 | 9 | 5 | 26 | 9 | 6 | 26 | 9 | 5 |
| C5 | 80 mT | 800 W | CO2 = 750 sccm, GR = 90 | No | 15 | 7 | 5 | 16 | 7 | 6 | 15 | 7 | 5 | 15 | 8 | 5 |
| C8 | 100 mT | 600 W | CO2/CH4 = 750/100 sccm | No | 25 | 8 | 6 | 21 | 9 | 6 | 24 | 10 | 5 | 22 | 13 | 5 |
| C15 | 100 mT | 600 W | CO2/N2 = 750/100 sccm | No | 43 | 17 | 7 | 49 | 16 | 7 | 42 | 16 | 8 | 45 | 15 | 8 |
| C9 | 80 mT | 800 W | CO2-750 sccm, GR90 | 10 mT CH4/Ar | 15 | 5 | 4 | 19 | 5 | 4 | 14 | 5 | 4 | 19 | 6 | 5 |
| C10 | 80 mT | 800 W | CO2-750 sccm, GR90 | 15 mT CH4/Ar | 14 | 4 | 4 | 16 | 4 | 4 | 15 | 5 | 5 | 18 | 5 | 5 |
| C12 | 80 mT | 800 W | CO2-750 sccm, GR90 | 50 mT CH4/Ar | 14 | 4 | 4 | 17 | 4 | 4 | 16 | 5 | 5 | 18 | 6 | 5 |
| C11 | 80 mT | 800 W | CO2-750 sccm, GR90 | 50 mT CH4/N2 | 15 | 4 | 4 | 19 | 4 | 4 | 15 | 6 | 5 | 19 | 6 | 5 |
| C13 | 80 mT | 800 W | CO2-750 sccm, GR90 | 50 mT CH4/Ar during ash | 17 | 7 | 5 | 22 | 7 | 6 | 18 | 7 | 6 | 21 | 6 | 6 | removal of photoresist from the substrate and contact with the underlying material film. For example, a portion of the spectrum that indicates such changes includes a wavelength of 482.5 nm (CO), and can be measured using optical emission spectroscopy (OES). After emission levels corresponding to the monitored wavelengths cross a specified threshold (e.g., drop to substantially zero or increase above a particular level), an endpoint can be considered to be complete. Other wavelengths that provide endpoint information can also be used. Furthermore, the etch time can be extended to include a period of over-ash, wherein the over-ash period constitutes a fraction (i.e. 1 to 100%) of the time between initiation of the etch process and the time associated with endpoint detection.

In an example, a method of removing a mask layer and post-etch residue following a dry etching process for transferring a pattern to an underlying dielectric layer is presented. The dielectric layer comprises an ultra-low-dielectric constant (ultra-low-k, or ULK) material. For example, the ULK material includes a porous SiCOH film formed using a plasma enhanced chemical vapor deposition (PECVD) process. The removal process may be performed utilizing a plasma processing device such as the one described in FIG. 3. However, the methods discussed are not to be limited in scope by this exemplary presentation.

As noted above, the present inventors discovered that using $CO_2$ in a plasma ashing process can reduce damage to the dielectric compared to an $O_2$ ashing process. The inventors have further discovered that varying certain aspects of the ashing process can reduce critical dimension shift for features As illustrated in Table 1, variations in the process conditions for the dry plasma ashing step are performed, including changes to the process pressure, bias RF power, and the process gas composition. From inspection of Table 1, an increase in the flow rate of $CO_2$ can lead to a marginal reduction in the CD shift for both dense and isolated features (see coupons C0 and C4). Additionally, a reduction in the process pressure can lead to a marginal reduction in the CD shift for both dense and isolated features (see coupons C1 and C2). Additionally yet, an increase in the bias RF power can lead to a marginal reduction in the CD shift for both dense and isolated features (see coupons C1 and C4). From further inspection of Table 1, the addition of a passivation gas including $CH_4$ to the process gas composition can lead to a marginal reduction in the CD shift for both dense and isolated features (see coupons C1 and C8). For coupon C5, 90% of the total flow of process gas is introduced above the substrate substantially near the center portion of the substrate, while the remaining 10% of the total flow rate of process gas is introduced substantially near the edge portion of the substrate. In doing so, the CD shift for both dense and isolated features is further reduced.

Referring still to Table 1, coupons C9 through C12 illustrate the effect of performing a pre-treatment step prior to the dry plasma ashing step. The pre-treatment step comprises exposing the substrate to plasma formed from a pre-treatment process gas having a hydrocarbon gas (such as $CH_4$) and an inert gas. The inert gas may include a noble gas, such as Ar, or it may include $N_2$. The use of a pre-treatment step affects a marginal reduction in the CD shift in both dense and isolated features. For coupon C13, the introduction of a hydrocarbon gas and an inert gas (Ar) is performed during the dry plasma ashing step. The pre-treatment process marginally affects the CD shift following the residue removal process(es).

Figure 7:
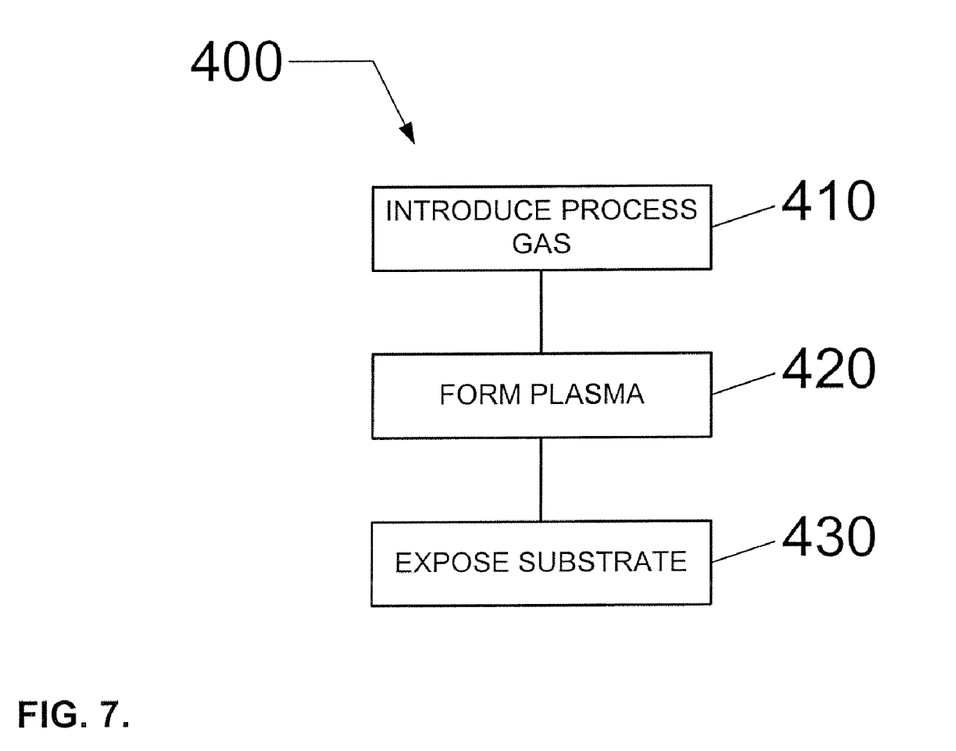
FIG. 7 presents a method of removing a mask layer on a substrate in a plasma processing system according to an embodiment of the invention.

FIG. 7 presents a flow chart of a method for removing residue on a substrate in a plasma processing system according to an embodiment of the present invention. Procedure 400 begins in 410 in which a process gas is introduced to the plasma processing system, wherein the process gas comprises carbon dioxide ($CO_2$). The process gas can further comprise a passivation gas. For example, the passivation gas can include a hydrocarbon gas ($C_xH_y$), wherein x, y represent integers greater than or equal to unity. The hydrocarbon gas ($C_xH_y$) can include one or more of $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$, or two or more thereof. Alternatively, the process gas can further comprise an inert gas, such as a Noble gas (i.e., He, Ne, Ar, Kr, Xe, Rn). Alternatively yet, the process gas can further comprise $O_2$, CO, NO, $NO_2$, or $N_2O$, or a combination of two or more thereof.

In 420, plasma is formed in the plasma processing system from the process gas using, for example, any one of the systems described in FIGS. 2 through 6, and combinations thereof.

In 430, the substrate comprising the residue, including but not limited to a photoresist layer or remnants of the photoresist layer, an ARC layer, or post-etch residue, is exposed to the plasma formed in 420. After a first period of time, procedure 400 ends. The first period of time during which the substrate with the photoresist layer is exposed to the plasma can generally be dictated by the time required to ash the photoresist layer. In general, the period of time required to remove the residue is pre-determined. Alternately, the period of time can be further augmented by a second period of time, or an over-ash time period. As described above, the over-ash time can comprise a fraction of time, such as 1 to 100%, of the first period of time, and this over-ash period can comprise an extension of ashing beyond the detection of endpoint.

According to another embodiment, the plasma ashing process described in steps 410 through 430 may be preceded by a pre-treatment process. The pre-treatment process can be utilized to passivate various surfaces prior to performing the plasma ashing process to remove any remaining mask layer and/or other residue.

Figure 8:
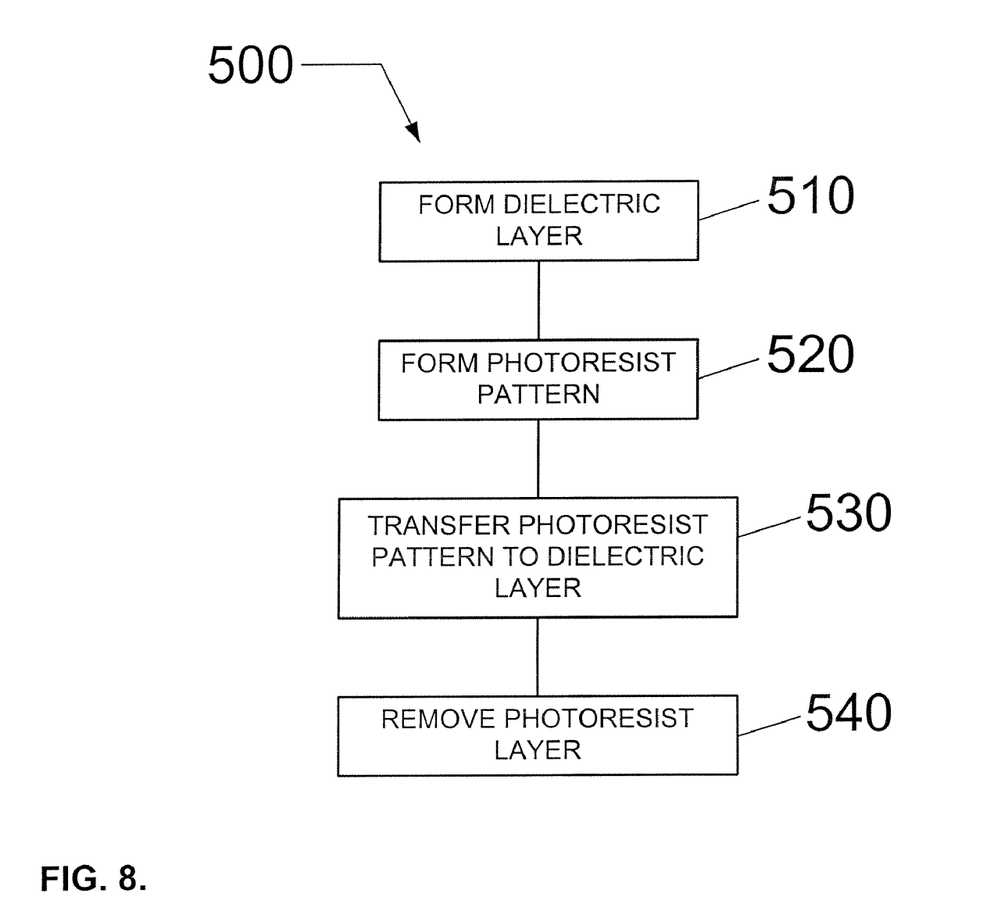
FIG. 8 presents a method of etching a thin film on a substrate according to another embodiment of the invention.

FIG. 8 presents a method of forming a feature in a dielectric layer on a substrate in a plasma processing system according to another embodiment of the present invention. The method is illustrated in a flowchart 500 beginning in 510 with forming the dielectric layer on the substrate. The dielectric layer can comprise an oxide layer, such as silicon dioxide ($SiO_2$), and it can be formed by a variety of processes including chemical vapor deposition (CVD). Alternately, the dielectric layer has a nominal dielectric constant value less than the dielectric constant of $SiO_2$, which is approximately 4 (e.g., the dielectric constant for thermal silicon dioxide can range from about 3.8 to about 3.9). More specifically, the dielectric layer may have a dielectric constant of less than about 3.0, or a dielectric constant ranging from about 1.6 to about 2.7.

Alternatively, the dielectric layer can be characterized as a low dielectric constant (or low-k) dielectric film. The dielectric layer may include at least one of an organic, inorganic, and inorganic-organic hybrid material. Additionally, the dielectric layer may be porous or non-porous. For example, the dielectric layer may include an inorganic, silicate-based material, such as oxidized organosilane (or organo siloxane), deposited using CVD techniques. Examples of such films include Black Diamond™ CVD organosilicate glass (OSG) films commercially available from Applied Materials, Inc., or Coral™ CVD films commercially available from Novellus Systems. Additionally, porous dielectric films can include single-phase materials, such as a silicon oxide-based matrix having $CH_3$ bonds that are broken during a curing process to create small voids (or pores). Additionally, porous dielectric films can include dual-phase materials, such as a silicon oxide-based matrix having pores of organic material (e.g., porogen) that is evaporated during a curing process. Alternatively, the dielectric film may include an inorganic, silicate-based material, such as hydrogen silsesquioxane (HSQ) or methyl silsesquioxane (MSQ), deposited using SOD techniques. Examples of such films include FOx HSQ commercially available from Dow Corning, XLK porous HSQ commercially available from Dow Corning, and JSR LKD-5109 commercially available from JSR Microelectronics. Still alternatively, the dielectric film can include an organic material deposited using SOD techniques. Examples of such films include SiLK-I, SiLK-J, SiLK-H, SILK-D, and porous SiLK semiconductor dielectric resins commercially available from Dow Chemical, and FLARE™, and Nano-glass commercially available from Honeywell.

In 520, a patterned mask layer, such as a patterned layer of photoresist, is formed on the substrate overlying the dielectric layer. The mask layer may include a single layer or a plurality of layers. For example, the mask layer may include one or more soft mask layers and optionally one or more hard mask layers. For example, a layer of photoresist can be formed using conventional techniques, such as a photoresist spin coating system. The pattern can be formed within the photoresist film by using conventional techniques such as a stepping micro-lithography system, and a developing solvent.

In 530, the mask layer pattern is transferred to the dielectric layer in order to form the feature in the dielectric layer. The pattern transfer is accomplished using a dry etching technique, wherein the etch process is performed in a plasma processing system. For instance, when etching oxide dielectric films such as silicon oxide, silicon dioxide, etc., or when etching inorganic low-k dielectric films such as oxidized organosilanes, the etch gas composition generally includes a fluorocarbon-based chemistry such as at least one of $C_4F_8$, $C_5F_8$, $C_3F_6$, $C_4F_6$, $CF_4$, etc. or a fluorohydrocarbon-based chemistry or a combination thereof, and at least one of an inert gas, oxygen, and CO. Additionally, for example, when etching organic low-k dielectric films, the etch gas composition generally includes at least one of a nitrogen-containing gas, and a hydrogen-containing gas. The techniques for selectively etching a dielectric film, such as those described earlier, are well known to those skilled in the art of dielectric etch processes.

In 540, the mask layer pattern, or remaining photoresist, or post-etch residue, etc., are removed. The removal of the mask layer is performed by exposing the substrate to a plasma formed of a process gas comprising $CO_2$. The process gas can further comprise a passivation gas. For example, the passivation gas can include a hydrocarbon gas ($C_xH_y$), wherein x, y represent integers greater than or equal to unity. The hydrocarbon gas ($C_xH_y$) can include one or more of $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$, or two or more thereof. Alternatively, the process gas can further comprise an inert gas, such as a Noble gas (i.e., He, Ne, Ar, Kr, Xe, Rn). Alternatively yet, the process gas can further comprise $O_2$, CO, NO, $NO_2$, or $N_2O$, or a combination of two or more thereof.

Plasma is formed in the plasma processing system from the process gas using, for example, any one of the systems described in FIGS. 2 through 6, and the substrate comprising the mask layer is exposed to the plasma formed. A period of time during which the substrate with the photoresist is exposed to the plasma can generally be dictated by the time required to remove the photoresist. In general, the period of time required to remove the photoresist layer is pre-determined. However, the period of time can be further augmented by a second period of time, or an over-ash time period. As described above, the over-ash time can comprise a fraction of time, such as 1 to 100%, of the period of time, and this over-ash period can comprise an extension of ashing beyond the detection of endpoint.

In one embodiment, the transfer of the photoresist pattern to the dielectric layer, and the removal of the photoresist are performed in the same plasma processing system. In another embodiment, the transfer of the photoresist pattern to the dielectric layer, and the removal of the photoresist are performed in different plasma processing systems.

According to another embodiment, the plasma ashing process described in step 540 may be preceded by a pre-treatment process. The pre-treatment process can be utilized to passivate various surfaces, including surfaces of the dielectric layer, prior to performing the plasma ashing process to remove any remaining mask layer and/or other residue. The pre-treatment process may be utilized to passivate the sidewalls of the feature formed in the dielectric layer in order to prevent a shift in the critical dimensions (CD) of the feature during the plasma ashing process. For example, the pre-treatment process can include exposing the mask layer and dielectric layer to plasma formed of a pre-treatment process gas comprising one or more hydrocarbon gases and, optionally, one or more inert gases, such as a noble gas or nitrogen.

According to yet another embodiment, the plasma ashing process described in step 540 may be adjusted in order to reduce the shift in CD of the feature formed in the dielectric layer during the plasma ashing process. For example, the flow rate of process gas to the region substantially above the center portion of the substrate may be varied relative to the flow rate of the process gas to the region substantially above the peripheral portion of the substrate.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for removing residue from a substrate, comprising:
   disposing said substrate in a plasma processing system, said substrate having: a dielectric layer formed thereon, and a mask layer overlying said dielectric layer, wherein said mask layer comprises a pattern formed therein and said dielectric layer comprises a feature formed therein as a result of an etching process used to transfer said pattern in said mask layer to said dielectric layer;
   pre-treating said mask layer prior to introducing a process gas comprising carbon dioxide ($CO_2$), wherein said pre-treating includes:
     introducing a pre-treatment process gas comprising a hydrocarbon gas and an inert gas;
     forming a pre-treatment plasma from said pre-treatment process gas in said plasma processing system; and
     exposing said mask layer and said dielectric layer to said pre-treatment plasma introducing a process gas comprising carbon dioxide ($CO_2$) into said plasma processing system;
   forming a plasma from said process gas in said plasma processing system; and
   removing said mask layer from said substrate with said plasma.

2. The method of claim 1, wherein said introducing said process gas further comprises introducing a passivation gas with said carbon dioxide ($CO_2$).

3. The method of claim 2, wherein said introducing said process gas further comprises introducing a hydrocarbon gas ($C_xH_y$), wherein x and y are integers greater than or equal to unity.

4. The method of claim 3, wherein said introducing of said process gas comprises one or more of $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$, or two or more thereof.

5. The method of claim 1, wherein said introducing of said process gas further comprises introducing an inert gas.

6. The method of claim 1, wherein said disposing comprises disposing a substrate having a low dielectric constant dielectric layer in said plasma processing system.

7. The method of claim 1, wherein said disposing comprises disposing a substrate having at least one of a porous dielectric layer, and a non-porous dielectric layer in said plasma processing system.

8. The method of claim 1, wherein said disposing comprises disposing a substrate having a dielectric layer including at least one of an organic material, and an inorganic material in said plasma processing system.

9. The method of claim 8, wherein said disposing comprises disposing a substrate having a dielectric layer including an inorganic-organic hybrid material in said plasma processing system.

10. The method of claim 8, wherein said disposing comprises disposing a substrate having a dielectric layer including an oxidized organo silane in said plasma processing system.

11. The method of claim 8, wherein said disposing comprises disposing a substrate having a dielectric layer including at least one of hydrogen silsesquioxane, and methyl silsesquioxane in said plasma processing system.

12. The method of claim 8, wherein said disposing comprises disposing a substrate having a dielectric layer including a silicate-based material in said plasma processing system.

13. The method of claim 10, wherein said disposing comprises disposing a substrate having a dielectric layer including a collective film including silicon, carbon, and oxygen in said plasma processing system.

14. The method of claim 13, wherein said disposing comprises disposing a substrate having hydrogen in said collective film.

15. The method of claim 1, wherein said introducing of said process gas further comprises introducing $O_2$, CO, NO, $NO_2$, or $N_2O$, or a combination of two or more thereof.

16. The method of claim 1, further comprising:
   maintaining pressure of a chamber of said plasma processing system at 80 mT; and
   coupling 800 W of RF power to said chamber.

17. The method of claim 16, wherein said introducing comprises flowing said process gas into said chamber at a flow rate of 750 sccm.

18. The method of claim 17, wherein 90% of a total flow of the process gas is introduced substantially near a center portion of the substrate and the remaining 10% of the total flow of process gas is introduced substantially near an edge portion of the substrate.

19. The method of claim 18, further comprising performing a pre-processing step by introducing a mixture of $CH_4$ and Ar into said chamber at a chamber pressure of between 10 mT and 50 mT.

20. A method for removing residue from a substrate, comprising;
  disposing said substrate in a plasma processing system, said substrate having: a dielectric layer formed thereon, and a mask layer overlying said dielectric layer, wherein said mask layer comprises a pattern formed therein and said dielectric layer comprises a feature formed therein as a result of an etching process used to transfer said pattern in said mask layer to said dielectric layer;
  introducing a process gas comprising carbon dioxide ($CO_2$) and a hydrocarbon gas ($C_xH_y$) as passivation gas, wherein x and y are integers greater than or equal to unity, into said plasma processing system;
  forming a plasma from said process gas in said plasma processing system; and
  removing said mask layer from said substrate with said plasma.

* * * * *